United States Patent [19]

Nero

[11] Patent Number: 5,087,863
[45] Date of Patent: Feb. 11, 1992

[54] FEEDBACK ARRANGEMENT IN A DEFLECTION CIRCUIT

[75] Inventor: Leroy W. Nero, Indianapolis, Ind.

[73] Assignee: Thomson Consumer Electronics, Inc., Indianapolis, Ind.

[21] Appl. No.: 670,113

[22] Filed: Mar. 15, 1991

[51] Int. Cl.[5] .................. H01J 29/70; H01J 29/72
[52] U.S. Cl. .................. 315/388; 315/387; 315/408
[58] Field of Search .................. 315/408, 387, 388

[56] References Cited

U.S. PATENT DOCUMENTS

| | | | |
|---|---|---|---|
| 3,174,073 | 3/1965 | Massman et al. | |
| 3,512,040 | 5/1970 | Lester | |
| 4,028,589 | 6/1977 | Verbeij | |
| 4,272,705 | 6/1981 | Beaumont | 315/408 |
| 4,323,825 | 4/1982 | Hayes | |
| 4,412,157 | 10/1983 | Gamboa | 315/408 |
| 4,468,593 | 8/1984 | Haferl | 315/408 |
| 4,647,823 | 3/1987 | Luz | |

OTHER PUBLICATIONS

A schematic diagram of a Chassis B-6510 of a television receiver Appollo 2550.
U.S. patent application Ser. No. 481,426, filed 04/21/89 in the name of B. E. Hennig.

Primary Examiner—Theodore M. Blum
Attorney, Agent, or Firm—Joseph S. Tripoli; Joseph J. Laks; Sammy S. Henig

[57] ABSTRACT

A driver stage of a horizontal deflection output transistor includes a transformer having a first winding coupled to a collector of a second, driver transistor responsive to an input signal at a horizontal deflection frequency. A second winding of the transformer is coupled across a base-emitter junction of the output transistor and a third winding is coupled to the emitter of and in series with the output transistor. The third winding couples the emitter current to the base of the output transistor for supplying a substantial portion of the base current during the second half of trace. A feedback network is coupled between a trace capacitor coupled to a horizontal deflection winding and the collector of the driver transistor for preventing abnormal steady state operation in the output transistor.

14 Claims, 3 Drawing Sheets

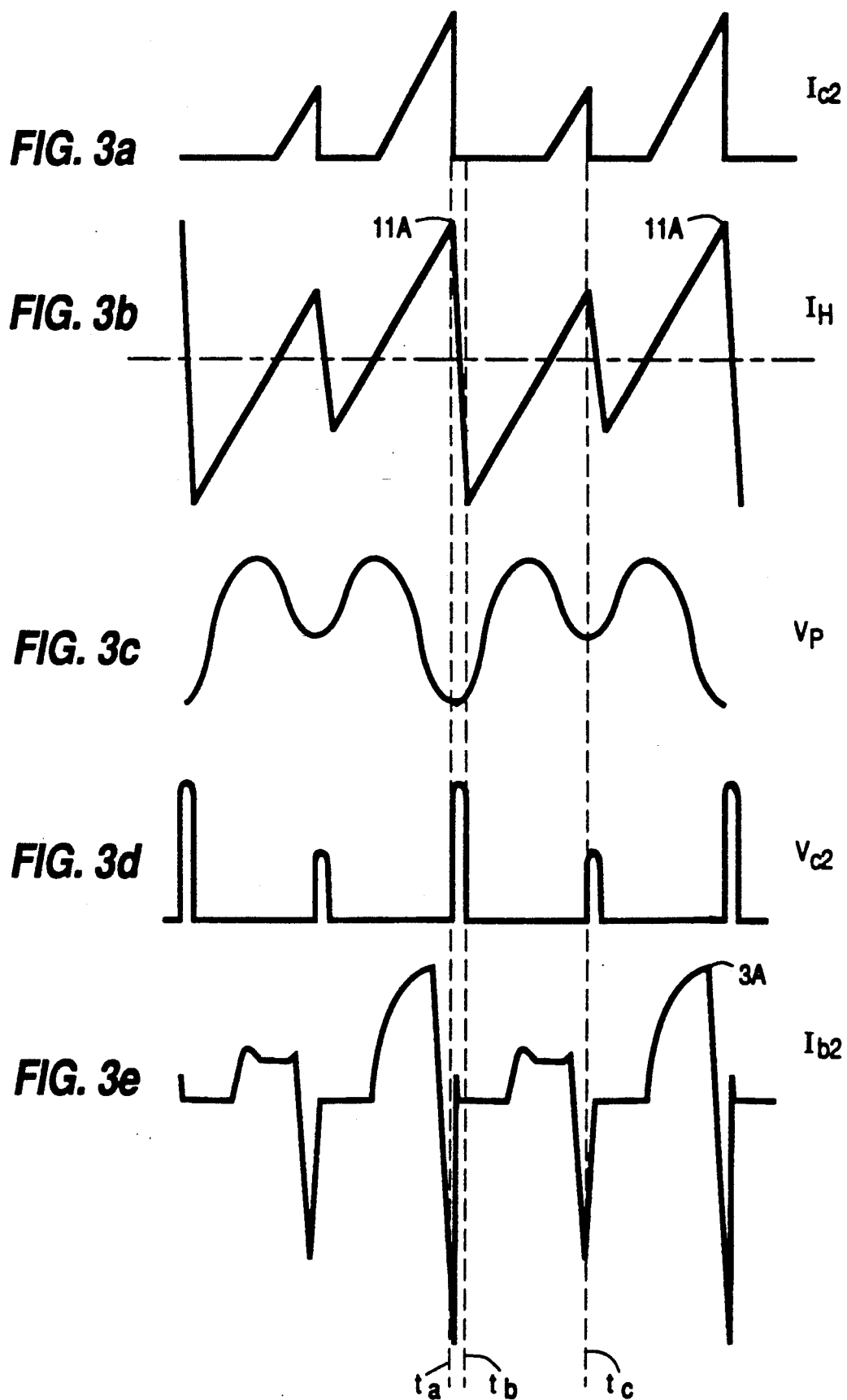

FEEDBACK ARRANGEMENT IN A DEFLECTION CIRCUIT

The invention relates to a deflection circuit output stage of a cathode ray tube (CRT) in a television receiver or other such display device. In particular, the invention relates to a feedback network in a horizontal deflection circuit output stage in which a switching output transistor, operating in a switching mode, produces a deflection current in a horizontal deflection winding of the CRT.

A typical horizontal deflection circuit that is used in various color television receivers includes a driver or drive stage having a transformer coupled to a control terminal of the output transistor of the deflection circuit output stage. The driver stage further includes a second switching transistor having a collector electrode that is coupled to a primary winding of the transformer. When the switching transistor of the driver stage is conductive, magnetic energy is stored in the inductance of the primary winding. At the same time, a transformer coupled voltage developed across a secondary winding of the transformer causes the switching output transistor of the output stage, driven by the voltage developed in the secondary winding of the transformer, to be non-conductive. When the second switching transistor of the driver stage becomes non-conductive, the stored magnetic energy in the coupling transformer produces, in a flyback manner, a winding current that flows in the secondary winding of the coupling transformer to form a forward base current. The forward base current drives the deflection output transistor into saturation prior to the beginning time of the upramping collector current in the output transistor.

In one prior art circuit, the transformer has a winding that is coupled in a current path of the collector current of the switching output transistor. In the second half of trace, the collector current in the output transistor increases in an upramping manner. The upramping collector current is coupled via the transformer to the base of the output transistor, in a positive feedback manner. The result is that an upramping base current is generated.

In such prior art circuit, the deflection circuit might operate in an abnormal stable state, should the value of the current gain parameter, $h_{FE}$, of the output transistor be greater than, for example, 6. In the abnormal stable state, the peak amplitude of the collector current is larger than in normal steady state operating condition, in alternate trace intervals, and smaller than in normal steady state operation, in the other alternate trace intervals. It may be desirable to prevent such abnormal steady state operation.

A television deflection apparatus, embodying an aspect of the invention, includes a deflection winding coupled to a retrace capacitance to form a retrace resonant circuit, during a retrace interval of a deflection cycle. A first switching transistor is responsive to a control signal at a frequency that is related to a deflection frequency developed at a control terminal of the transistor. The transistor has a main current conducting terminal that is coupled to the retrace resonant circuit for generating a deflection current in the deflection winding. During a portion of a trace interval of the deflection cycle, at least a portin of the deflections current flows in the main current conducting terminal. A transformer has a first winding that is coupled to the control terminal of the first switching transistor and a second winding responsive to a signal produced by the first switching transistor. The transformer developes a ramping portion of the control signal in a positive feedback manner with respect to the current in the main current conducting terminal of the first switching transistor. A feedback network responsive to a signal produced by the first switching transistor develops a feedback signal that is applied to a control terminal of the first switching transistor in a negative feedback manner with respect to the current in the main current conducting terminal.

In accordance with an inventive feature, the feedback signal prevents the aforementioned abnormal steady state operation.

FIGS. 3a–3e illustrate waveforms in abnormal steady state operation for a deflection such as in FIG. 1 but without the feedback network of FIG. 1.

Figure 1:
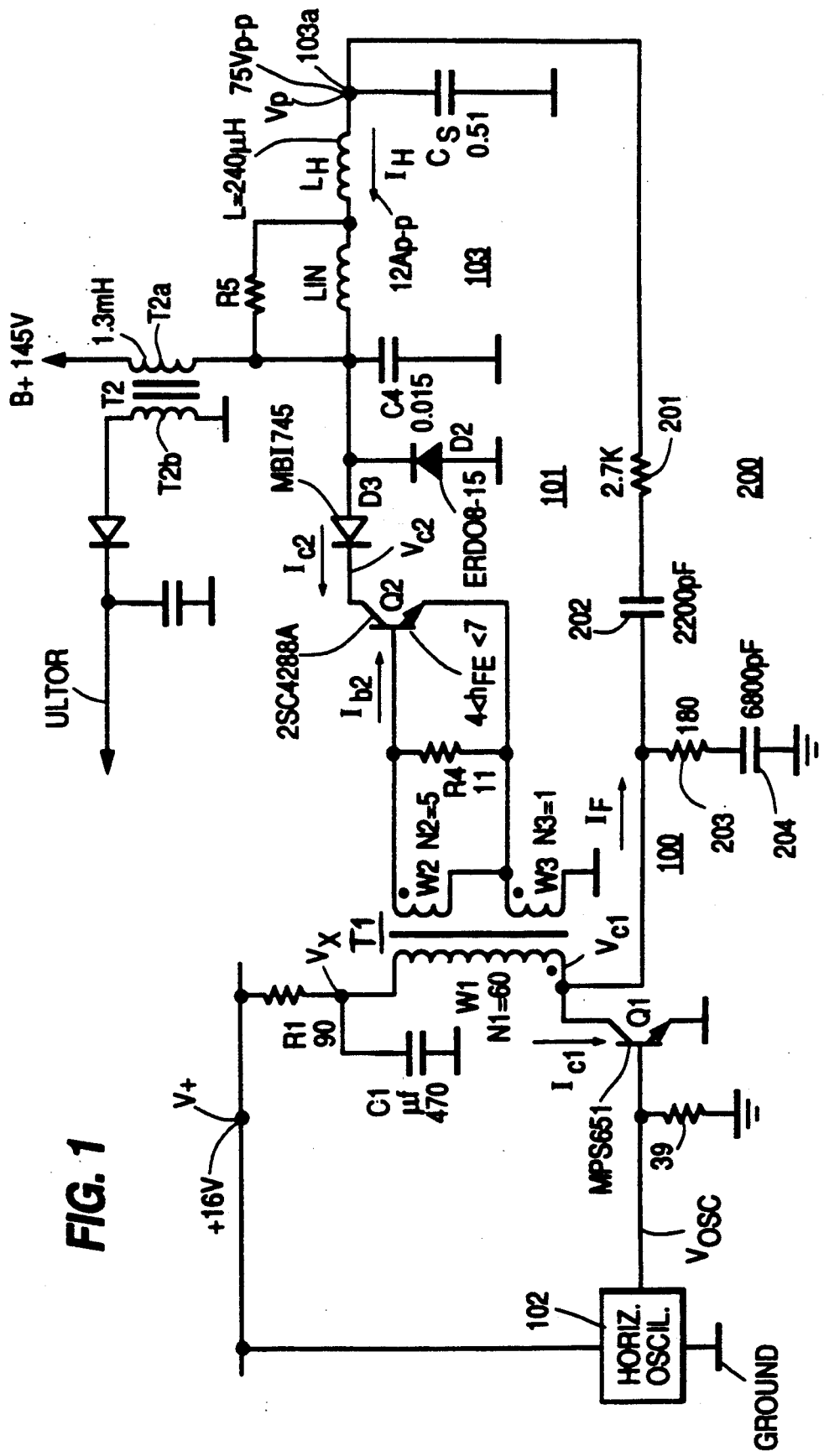
FIG. 1 illustrates a horizontal deflection circuit output stage including a feedback network, embodying an aspect of the invention, coupled from a trace capacitor to a driver stage.

FIG. 1 illustrates a driver stage 100 for driving a switching output transistor Q2 of a horizontal deflection circuit output stage 101 of a television receiver, embodying an aspect of the invention. A conventional horizontal oscillator 102 produces an output signal $V_{OSC}$. Signal $V_{OSC}$ is at a horizontal frequency of $2 \times f_H$ that is approximately 32 KHZ Signal $V_{OSC}$ is coupled via an emitter follower, not shown, to a base electrode of a driver transistor Q1. Frequency $f_H$, that is about 16 KHZ, is the horizontal deflection frequency in, for example, the NTSC standard. Thus, frequency $2 \times f_H$ is substantially higher than 16 KHZ.

Oscillator 102 is controlled by an on/off control signal. Signal on/off causes transistor Q1 to be turned on when signal on/off is at the "OFF" state, throughout standby operation. A collector of transistor Q1 is coupled to one end terminal of a primary winding W1 of a coupling transformer T1. The other end terminal of winding W1 is bypassed to ground by a filter capacitor C1 and coupled via a current limiting resistor R1 to a source of supply voltage V+ such that resistor R1 and capacitor C1 form a ripple filter.

A secondary winding W2 of transformer T1 is coupled across a base-emitter junction of transistor Q2 and across a resistor R4. A junction terminal 101a that is coupled at a junction of winding W2, resistor R4 and the emitter of transistor Q2 is coupled to one end terminal of a winding W3 of transformer T1. The other end terminal of winding W3 is coupled to ground.

The collector of transistor Q2 is coupled in series with a diode D3 to a conventional damper diode D2 of a horizontal deflection circuit 103. Circuit 103 includes a horizontal deflection winding $L_H$, a retrace capacitor C4, a trace capacitor $C_S$, a linearity inductor LIN, and a linearity resistor R5 that are coupled in a well-known manner. Diode D3 prevents reverse collector current from flowing in transistor Q2 and in winding W2 or W3. A supply voltage B+ is coupled to circuit 103 via a winding T2a of a horizontal flyback transformer T2. During retrace, circuit 103 forms a retrace resonant circuit that includes capacitor C4, winding $L_H$ and winding LIN. During trace, circuit 103 forms a trace resonant circuit that includes trace capacitor $C_s$ and winding $L_H$. Voltages B+ and V+ are produced both in standby and in run mode operations.

FIGS. 2a–2d illustrate idealized or approximated waveforms useful for explaining the normal operation of the circuit of FIG. 1. Similar symbols and numerals in FIGS. 1 and 2a–2d indicate similar items or functions.

Figure 2A:
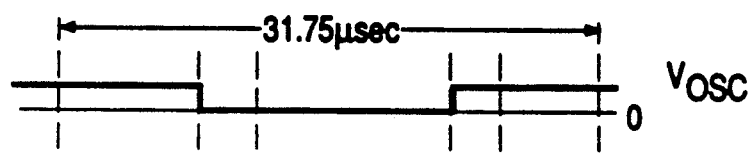
FIGS. 2a–2d illustrate waveforms useful for explaining the operation of the circuit of FIG. 1 in normal operation.

In operation, driver transistor Q1 of FIG. 1 is conductive as a result of signal $V_{OSC}$ of FIG. 2a being positive until time $t_1$ of FIG. 2a that causes transistor Q2 to be nonconductive. The magnetic energy supplied by a collector current $I_{c1}$ of transistor Q1 is stored in winding W1 of FIG. 1. When transistor Q1 is turned off, during interval $t_1$–$t_3$ of FIG. 2a, the stored energy produces in winding W2 of FIG. 1 a forward base current $I_{b2}$ of transistor Q2. Current $I_{b2}$ is sufficient to turn on deflection transistor Q2 and to maintain it in saturation prior to time $t_2$ of FIG. 2b.

Figure 2B:

The amplitude of current $I_{b2}$ of FIG. 2b remains substantially constant during a latter portion of the first half of trace, interval $t_1$–$t_2$. This is so because windings W2 and W3 are heavily loaded by the low impedance of the base-emitter junction of transistor Q2. At time $t_2$, a deflection current $I_H$ in deflection winding $L_H$ of FIG. 1 reverses polarity. As a result of current reversals in deflection winding $L_H$ of circuit 103 of FIG. 1 and in a flyback transformer winding T2a, collector current $I_{c2}$ starts flowing in transistor Q2 of FIG. 1 after time $t_2$ of FIG. 2c in an upramping manner.

Upramping collector current $I_{c2}$ that flows as an emitter current through winding W3 of FIG. 1 is transformer-coupled through current transformer T1 to the base of transistor Q2 in accordance with a turns ratio N2:N3 of windings W2 and W3, respectively. Transformer coupled current $I_{c2}$ provides a major portion of upramping forward base current $I_{b2}$ of transistor Q2, during the second half of trace, interval $t_2$–$t_3$, when collector current $I_{c2}$ is upramping. The base-emitter junction of transistor Q2 forms a very low impedance across winding W2. Therefore, a performance similar to that of an ideal current transformer operation is obtained in transformer T1 for coupling the current in winding W3 to winding W2. The required turn ratio between windings W2 and W3 is determined by the current gain $h_{FE}$ of transistor Q2. Current gain $h_{FE}$ is within a tolerance range of, for example, 4 and 7.

Figure 2C:
Figure 2D:
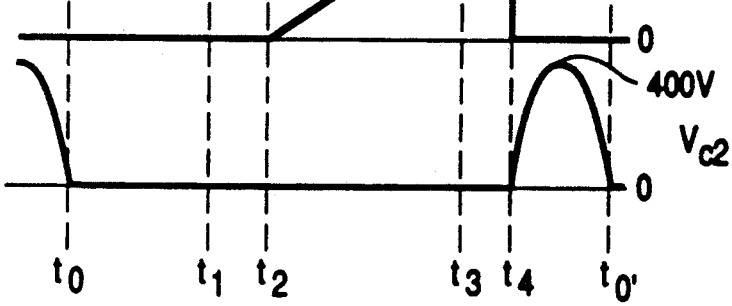

Upramping base current that is proportional to current $I_{c2}$ induced in winding W2 of FIG. 1 only after time $t_2$ of FIG. 2b. Transformer coupled upramping current $I_{c2}$ of FIG. 2c is added to the aforementioned current already provided by the stored magnetic energy in transformer T1 of FIG. 1 to form upramping base current $I_{b2}$ of FIG. 2b. During interval $t_2$–$t_3$, base current $I_{b2}$ is produced mainly from current $I_{c2}$ of FIG. 2c. The rate of change of current $I_{b2}$ of FIG. 2b closely tracks the base current requirement of deflection transistor Q2 of FIG. 1 having upramping collector current $I_{c2}$ of FIG. 2c. Thus, with respect to collector current $I_{c2}$, base current $I_{b2}$ varies in a positive feedback manner. Therefore, the conductivity of transistor Q2 of FIG. 1 is controlled in a manner that maintains transistor Q2 in saturation without significantly overdriving the base of transistor Q2, during the second half of trace interval, $t_2$–$t_3$ of FIG. 2b. Cut-off of transistor Q2 of FIG. 1 is initiated at time $t_3$ of FIG. 2c, when transistor Q1 of FIG. 1 is switched into saturation, as explained in a copending U.S. patent application Ser. No. 481,426 entitled, A DEFLECTION DRIVER IN A VIDEO APPARATUS, in the name of Bruno E. Hennig, that is incorporated by reference herein.

A feedback network 200, embodying an inventive feature, includes a capacitor 202 coupled in series with a resistor 201. Network 200 is coupled between a terminal 103a of trace capacitor $C_S$ and the collector electrode of transistor Q1. Terminal 103a is coupled between capacitor $C_S$ and winding $L_H$. A resistor 203 is coupled in series with a capacitor 204 to form a damping network arrangement that is coupled to the collector electrode of transistor Q1. Network 200 prevents the occurrence of an abnormal steady state operation.

FIGS. 3a–3e illustrate approximate waveforms that occur in such abnormal steady state operation under the conditions that network 200 is removed from the circuit of FIG. 1 and the $h_{FE}$ of transistor Q2 is larger than, for example, 6. Similar symbols and numerals in FIGS. 1, 2a–2d and 3a–3c indicate similar items or functions.

When the nominal value of the $h_{FE}$ is larger than, for example, 6, base current $I_{b2}$ of FIG. 1 is capable of driving transistor Q2 into saturation at a level of collector current $I_{c2}$, at the end of trace, that is higher than in normal operation. The negative peak amplitude of current $I_H$ at time $t_b$ of FIG. 3b, at the end of retrace, is approximately equal to the positive peak amplitude of current $I_H$ at time $t_a$, at the end of trace. During trace, the rate of change of current $I_H$ is predetermined and established by circuit parameters such as voltage B+. The excessively large peak amplitude of current $I_H$ at times $t_a$ and $t_b$ of FIG. 3b causes the positive peak amplitude of current $I_H$ at time $t_c$, at the end of the following trace interval, to be smaller than at time $t_a$, at the end of the preceding trace interval.

Thus, in the abnormal steady state operation, each of peak collector current $I_{c2}$ of FIG. 3a and of base current $I_{b2}$ of FIG. 3e of transistor Q2 of FIG. 1 is larger than in normal steady state operation, in alternate trace intervals. On the other hand, in the other alternate trace intervals, the peaks of collector current $I_{c2}$ of FIG. 3a and base current $I_{b2}$ of FIG. 3e are smaller than in normal steady state operation. Also the peak amplitude of each of flyback collector voltage $V_{c2}$ of FIG. 3d and of deflection current $I_H$ of FIG. 3b is larger than in normal operation, in alternate deflection cycles.

When collector current $I_{c2}$ of transistor Q2 of FIG. 1 is at the peak level, at the end of trace, the $h_{FE}$ becomes even smaller than its nominal value. The abnormal steady state does not occur when the nominal value of the $h_{FE}$ is smaller than, for example, 6. It is believed that base current $I_{b2}$ produced in a positive feedback manner through transformer T1 cannot sustain the large peak level of current $I_{c2}$ at the end of trace, when the nominal value of the $h_{FE}$ is smaller than, for example, 6. It follows that only normal steady state operation can be sustained in which the peak level of current $I_{c2}$ of FIG. 2c is the same in each cycle.

Network 200 that includes resistor 201, coupled in series with capacitor 202, forms a feedback path between terminal 103a of trace capacitor $C_S$, that forms with deflection winding $L_H$ a trace resonant circuit, and the collector electrode of drive transistor Q1. A feedback current $I_F$ is produced in network 200, by a differentiation action, from a parabola voltage $V_P$ of FIG. 3c developed across capacitor $C_S$ of FIG. 1. Voltage $V_P$, that is downramping during the second half of trace, produces current $I_F$ of FIG. 1 that flows in the direction of the arrow. Current $I_F$ is applied via winding W1 of transformer T1 in a manner that bypasses winding W3 to the base of transistor Q2.

Current $I_F$ is applied in a negative feedback manner with respect to the collector current $I_{c2}$. Current $I_F$ produced by network 200 causes base current $I_{b2}$ to be smaller than what would be required for sustaining the abnormal steady state operation. Therefore, it is believed, base current $I_{b2}$ cannot sustain the abnormal steady state operation. Thus, advantageously, only normal operation base and collector currents can be produced in transistor Q2 for any nominal value of the $h_{FE}$ of transistor Q2 selected from a tolerance range of values between, for example, 4 and 7. As explained before, without network 200, normal operation can be obtained when the $h_{FE}$ is, for example, smaller than 6, but not when it is greater than 6.

What is claimed is:

1. A deflection apparatus of a video display apparatus, comprising:
    a deflection winding coupled to a retrace capacitance to form a retrace resonant circuit, during a retrace interval of a deflection cycle;
    a first switching transistor responsive to a control signal at a frequency that is related to a deflection frequency developed at a control terminal of said transistor and having a main current conducting terminal that is coupled to said retrace resonant circuit for generating a deflection current in said deflection winding such that, during a portion of a given trace interval of said deflection cycle, at least a portion of said deflection current flows in said main current conducting terminal;
    a transformer having a first winding that is coupled to said control terminal of said first switching transistor and a second winding responsive to a signal produced by said first switching transistor for developing a ramping portion of said control signal in a positive feedback manner with respect to the current in said main current conducting terminal of said first switching transistor such that a change in said current that flows in said main current conducting terminal of said first switching transistor, occurring in a ramping manner during said portion of said given trace interval, produces a change in said ramping portion of said control signal during the same portion of said given trace interval; and
    a feedback network responsive to a signal produced by said first switching transistor for developing a feedback signal that is applied to a control terminal of said first switching transistor in a negative feedback manner with respect to the current in said main current conducting terminal.

2. An apparatus according to claim 1 further comprising, a source of an input signal at a frequency that is related to said deflection frequency and a second switching transistor responsive to said input signal and having a main current conducting terminal that is coupled to a third winding of said transformer for generating a switching current in said third winding that is transformer coupled via said transformer to said control terminal of said first switching transistor to control timing of the switching in said first switching transistor.

3. A deflection apparatus according to claim 2 wherein said feedback network comprises a first capacitor having a first terminal that is coupled to a junction terminal between said second switching transistor and said third winding.

4. A deflection apparatus according to claim 3 wherein said feedback network further comprises a resistor that is coupled in series with said first capacitor.

5. A deflection apparatus according to claim 3 further comprising, a trace capacitor coupled to said deflection winding wherein a second terminal of said first capacitor is coupled to a junction terminal between said trace capacitor and said deflection winding.

6. A deflection apparatus according to claim 2 further comprising, first switching means coupled in parallel with said first switching transistor for conducting at least a substantial portion of said deflection current in a manner that bypasses said first switching transistor during a first half of said trace interval of said deflection cycle such that during a second half of said trace interval, at least a substantial portion of said deflection current is conducted, instead, in said first switching transistor, wherein said second switching transistor generates said current in said third winding prior to an instant within said trace interval when the current is switched over from being conducted in said first switching means to being conducted in said first switching transistor.

7. A deflection apparatus according to claim 2 wherein said second switching transistor produces in said transformer a first portion of said control signal in a flyback manner that initiates turn-on operation in said first switching transistor and a second portion of said control signal that initiates a turn-off operation in said first switching transistor.

8. A deflection apparatus according to claim 1 wherein said second winding is coupled in a main current path of said first switching transistor such that a current that flows in said main current path is coupled to said control terminal of said first switching transistor via said second winding.

9. A deflection apparatus according to claim 8 wherein said first switching transistor comprises a bipolar transistor and wherein said first winding is coupled to a base electrode of said first switching transistor for generating said control signal as a ramping base current, during a second half of said trace interval.

10. A deflection apparatus according to claim 1 wherein said first switching transistor comprises a bipolar transistor and wherein said second winding is coupled to an emitter electrode thereof such that said emitter electrode thereof is interposed between said deflection winding and said second winding.

11. A deflection apparatus according to claim 1 wherein said deflection current is at a substantially higher frequency than 16 KHZ.

12. A television deflection apparatus, comprising:
    a deflection retrace resonant circuit including a deflection winding and a retrace capacitance;
    a first switching transistor responsive to a control signal and coupled to said retrace resonant circuit for performing a switching operation that generates a deflection current in said deflection winding;
    a deflection oscillator for generating an input signal at a frequency that is related to a deflection frequency;
    a driver stage responsive to said input signal for generating a drive signal;
    a deflection driver transformer having a first winding that is coupled to said driver stage and is responsive to said drive signal, a second winding that is coupled to a control terminal of said first switching transistor and a third winding that is coupled in a collector current path of said first switching transistor for transformer coupling each of said drive signal and collector current to said control terminal of said first switching transistor to develop corresponding portions of said control signal at said control terminal; and a feedback network responsive to a signal that is produced by said first switching transistor and coupled to said control terminal of said first switching transistor via a signal path that bypasses said third winding for generating a feedback signal that is coupled to said control terminal of said first switching transistor.

13. A deflection apparatus of a video display apparatus comprising:

a deflection winding coupled to a trace capacitor to form a trace resonant circuit for developing a parabolic voltage in said trace capacitor, during a trace interval of a deflection cycle, said deflection winding being coupled to a retrace capacitance to form a retrace resonant circuit, during a retrace interval of said deflection cycle;

a first switching transistor responsive to a control signal at a frequency that is related to a deflection frequency and coupled to said resonant circuits for performing a switching operation that generates a deflection current in said deflection winding current;

a source of an input signal at a frequency that is related to a deflection frequency;

a driver stage responsive to said input signal and coupled to said first switching transistor for generating said control signal; and a feedback network having a first terminal that is coupled between said trace capacitor and said deflection winding and a second terminal that is coupled to said driver stage, said feedback network including means for differentiating said parabolic voltage to produce a feedback signal that is developed at said second terminal.

14. A deflection apparatus of a video display apparatus comprising:

a deflection winding coupled to a trace capacitor to form a trace resonant circuit during a trace interval of a deflection cycle and coupled to a retrace capacitance to form a retrace resonant circuit, during a retrace interval of said deflection cycle;

a first switching transistor responsive to a control signal at a frequency that is related to a deflection frequency and coupled to said resonant circuits for performing a switching operation that generates a deflection current in said deflection winding current;

a transformer having a first winding that is coupled to a control terminal of said first switching transistor and a second winding that is coupled in a current path of a current that flows in a main current conducting terminal of said first switching transistor to develop a first portion of said control signal in a positive feedback manner;

a source of an input signal at a frequency that is related to a deflection frequency; and a second switching transistor responsive to said input signal and coupled to a third winding of said transformer for generating a switching current in said second switching transistor and in said third winding of said transformer that is transformer coupled via said transformer to said control terminal of said first switching transistor to develop a second portion of said control signal at said control terminal; and a feedback network having a first terminal that is coupled to one of said resonant circuits and a second terminal that is coupled to said third winding of said transformer.

* * * * *